US00RE37409B1

(19) United States
(12) Reissued Patent
Barth et al.

(10) Patent Number: US RE37,409 E
(45) Date of Reissued Patent: Oct. 16, 2001

(54) MEMORY AND METHOD FOR SENSING SUB-GROUPS OF MEMORY ELEMENTS

(75) Inventors: Richard M. Barth, Palo Alto; Donald C. Stark, Los Altos Hills; Lawrence Lai, San Jose; Wayne S. Richardson, Saratoga, all of CA (US)

(73) Assignee: Rambus Inc., Los Altos, CA (US)

(21) Appl. No.: 09/559,836

(22) Filed: Apr. 26, 2000

Related U.S. Patent Documents

Reissue of:
(64) Patent No.: 5,748,554
Issued: May 5, 1998
Appl. No.: 08/771,303
Filed: Dec. 20, 1996

(51) Int. Cl.[7] ..... G11C 13/00
(52) U.S. Cl. ..... 365/230.03; 365/230.06; 365/230.08
(58) Field of Search ..... 365/189.01, 189.04, 365/230.01, 230.03, 230.04, 230.08

(56) References Cited

U.S. PATENT DOCUMENTS 4,377,855 * 3/1983 Lavi .
4,542,483 * 9/1985 Procyk .
4,569,036 * 2/1986 Fuji et al. .
4,646,268 * 2/1987 Kuno .
4,698,788 * 10/1987 Flannagan et al. .
4,700,328 * 10/1987 Burghard .
4,710,902 * 12/1987 Pelley, III et al. .
4,730,275 * 3/1988 Baskett .

(List continued on next page.)

OTHER PUBLICATIONS

H. Toshihiko., "A 20–ns 4Mb CMOS SRAM with Hierarchical Word Decoding Architecture," IEEE Journal of Solid State Circuits, vol. 25 No. 5, pp. 1068–1074 (Oct. 1990).

(List continued on next page.)

*Primary Examiner*—Terrell W. Fears
(74) *Attorney, Agent, or Firm*—Charles E. Shemwell

(57) ABSTRACT

A memory and method of operation is disclosed. In one embodiment, the memory includes a group of memory cells divided into a plurality of subgroups. Sub word-lines are selectively coupled to main word lines, each sub-word line corresponding to a subgroup and is coupled to the memory cells in the row of the corresponding subgroup. Sense amplifier circuitry is coupled to the group of memory cells. The sense amplifier circuitry is divided into a plurality of sub-sensing circuits, each of the plurality of sub-sensing circuits selectively coupled to a corresponding one of the plurality of sub-groups. The memory includes a control mechanism to control the word lines and sub-sensing circuit (s) that are activated at any one time such that only those sub-word lines and sub-sensing circuits needed to perform memory operations are operated and consume power. In an alternate embodiment, the control mechanism controls the sub-word lines and sub-sensing circuits to enable substantially concurrent access to different sub-groups of memory cells from different rows of the memory.

65 Claims, 8 Drawing Sheets

U.S. PATENT DOCUMENTS

| | | | | |
|---|---|---|---|---|
| 4,740,921 | * | 4/1988 | Lewandowski et al. . | |
| 4,758,993 | * | 7/1988 | Takamae . | |
| 4,787,858 | * | 11/1988 | Killian, Jr. . | |
| 4,796,230 | * | 1/1989 | Young . | |
| 4,800,525 | * | 1/1989 | Shah et al. . | |
| 4,811,302 | * | 3/1989 | Koishi | 365/222 |
| 4,825,413 | * | 4/1989 | Tran . | |
| 4,837,743 | * | 6/1989 | Chiu et al. . | |
| 4,843,264 | * | 6/1989 | Galbraith . | |
| 4,862,421 | * | 8/1989 | Tran . | |
| 4,888,732 | * | 12/1989 | Inoue et al. | 365/51 |
| 4,903,344 | * | 2/1990 | Inoue et al. | 365/51 |
| 4,961,168 | * | 10/1990 | Tran | 365/189.11 |
| 4,982,370 | * | 1/1991 | Matsumoto et al. | 365/222 |
| 4,984,196 | * | 1/1991 | Tran et al. | 365/51 |
| 4,991,141 | * | 2/1991 | Tran | 365/207 |
| 5,046,050 | * | 9/1991 | Kertis . | |
| 5,093,806 | * | 3/1992 | Tran | 365/189.11 |
| 5,111,434 | * | 5/1992 | Cho | 365/207 |
| 5,119,340 | * | 6/1992 | Slemmer . | |
| 5,121,358 | * | 6/1992 | Slemmer et al. . | |
| 5,124,610 | * | 6/1992 | Conley et al. . | |
| 5,124,951 | * | 6/1992 | Slemmer | 365/230.06 |
| 5,128,897 | * | 7/1992 | McClure | 365/230.06 |
| 5,132,931 | * | 7/1992 | Koker | 365/210 |
| 5,181,205 | * | 1/1993 | Kertis | 371/21.1 |
| 5,193,072 | * | 3/1993 | Frenkil et al. | 365/222 |
| 5,193,074 | | 3/1993 | Anami . | |
| 5,214,610 | * | 5/1993 | Houston | 365/233.5 |
| 5,241,503 | * | 8/1993 | Cheng | 365/205 |
| 5,249,165 | * | 9/1993 | Toda | 365/189.04 |
| 5,251,178 | * | 10/1993 | Childers | 365/227 |
| 5,263,002 | * | 11/1993 | Suzuki et al. | 365/230.03 |
| 5,267,215 | * | 11/1993 | Tsujimoto | 365/230.03 |
| 5,274,596 | * | 12/1993 | Watanabe | 365/203 |
| 5,291,444 | * | 3/1994 | Scott et al. | 365/189.05 |
| 5,305,280 | * | 4/1994 | Hayano | 365/230.03 |
| 5,321,646 | * | 6/1994 | Tomishima | 365/51 |
| 5,337,283 | * | 8/1994 | Ishikawa | 365/222 |
| 5,343,438 | * | 8/1994 | Choi et al. . | |
| 5,383,159 | * | 1/1995 | Kubota | 365/207 |
| 5,390,308 | * | 2/1995 | Ware et al. . | |
| 5,406,526 | | 4/1995 | Sugibayashi et al. . | |
| 5,414,662 | * | 5/1995 | Foss et al. . | |
| 5,418,737 | * | 5/1995 | Tran . | |
| 5,455,802 | * | 10/1995 | McClure | 365/233 |
| 5,471,425 | * | 11/1995 | Yumitori et al. | 365/190 |
| 5,485,430 | * | 1/1996 | McClure | 365/233 |
| 5,517,456 | | 5/1996 | Chishiki . | |
| 5,587,960 | | 12/1996 | Ferris . | |

OTHER PUBLICATIONS

SP 23.1: A 60ns 1 Mb Nonvolatile Ferroelectric Memory with Non–Driven Cell Plate Line Write/Read Scheme, IEEE International Solid–State Circuits Conference, 1996, pp. 368–369.*

SP 23.2: A 1MB, 100MHz Integrated L2 Cache Memory with 128b Interface and ECC Protection, IEEE International Solid–State Circuits Conference, 1996, pp. 370–371.*

SP 23.5: A 16.GB/s Data–Rate 1Gb Synchronous DRAM with Hierarchical Square–Shaped Memory Block and Distributed Bank Architecture, IEEE International Solid–State Circuits Conference, 1996, pp. 376–377.*

SP 23.4: A 2.5ns Clock Access 250MHz 256Mb SDRAM with a Synchronous Mirror Delay, IEEE International Solid–State Circuits Conference, 1996, pp. 374–375, 300–301, 480.*

SP 23.6 A 32–Bank 1 Gb DRAM with 1GB/s Bandwidth, IEEE International Solid–State Circuits Conference, 1996, pp. 378–379, 304–305, 481–482.*

SP 23.3: A 7.68GIPS 3.84GB/s 1W Parallel Image–Processing RAM Integrating a 16Mb DRAM and 128 Processors, IEEE International Solid–State Circuits Conference, 1996, pp. 372–373, 298–299, 479.*

"Two–Dimensional Power–Line Selection Scheme for Low Subthreshold–Current Multi–Gigabit DRAM's", IEEE Journal of Solid–State Circuits, vol. 29, No. 8, Aug. 1994, pp. 887–893.*

FA 14.4: A 150 MHz 8–Banks 256M Synchronous DRAM with Wave Pipelining Methods, IEEE International Solid–State Circuits Conference, 1995, pp. 250–251, 192–193, 356–357.*

FA 142: A 29ns 64 Mb DRAM with Hierarchical Array Architecture, IEEE International Solid–State Circuits Conference, 1995, p. 246–247, 188–189, 355.*

WP 3.5: A 30ns 256Mb DRAM with Multi–Divided Array Structure, IEEE International Solid–State Circuits Conference, 1993, pp. 50–51, 40–41, 215.*

A 30ns 256–Mb DRAM with a Multidivided Array Structure, IEEE Journal of Solid–State Circuits, vol. 28, No. 11, Nov. 1993, pp. 1092–1097.*

Session XVIII: STATIC RAMs, FAM 18.6: A 64Kb CMOS RAM, IEEE International Solid–State Circuits Conference, 1982, pp. 258–259.*

* cited by examiner

MEMORY AND METHOD FOR SENSING SUB-GROUPS OF MEMORY ELEMENTS

Matter enclosed in heavy brackets [ ] appears in the original patent but forms no part of this reissue specification; matter printed in italics indicates the additions made by reissue.

FIELD OF THE INVENTION

The present invention pertains to the field of computer memories. More specifically, the present invention relates to sub-word line access in computer memories.

BACKGROUND OF THE INVENTION

Memory cells are typically physically and logically oriented in rows and columns, and share word lines and bit lines, respectively. In a dynamic random access memory, for example, a memory cell consists of a transistor and a capacitor connected to a bit tine and a word line. The word line selects a memory cell. The bit line is what connects the memory cell to the sense amplifier to transfer data.

This is illustrated in the simplified diagram of FIG. 1a. Referring to FIG. 1a, a word line metal 110, is coupled to word line gate polysilicon 115 which runs in parallel with word line metal 110. Metal-polysilicon straps 120 are periodically added to reduce resistance. When the word line metal 110 is activated, word line gate polysilicon 115 is activated and enables the sense amplifiers 125 to sense or restore data to/from the coupled memory cells (not shown). The operations performed by sense amplifiers 125 are controlled by control signals 127, 129.

FIG. 1b illustrates a dual word line example. In this example, word line metal 110 is selectively connected to one of two word line gate polysilicon 117, 119 through AND gates 130, 135. Typically the AND gates are placed at intervals along the word lines and 110, gate polysilicon 117, 119 corresponding to locations of word line straps. Select signals 140, 145, which are complementary signals, are input to the AND gates 130, 135 to select the word line gate polysilicon to couple to the word line metal.

Some manufactures have encountered performance problems utilizing longer word line lengths. This is due to increased capacitance and resistance. To minimize longer word line lengths effects, the word line polysilicon is broken up into a plurality of segments. When the word line metal is activated, all of the segments are activated, effectively activating the entire word line polysilicon composed of the segments.

All of these circuits require that the entire word line gate polysilicon associated with a particular row of memory cells be raised, even if only a small portion of the row of memory cells required access. In addition, the entire column of sense amplifiers is activated to perform the memory operation. For example, if a read operation is performed with respect to a subset of a row of memory cells, the entire word line gate polysilicon associated with a particular row of memory cells and the entire column of sense amplifiers are activated to transfer the data of the entire row to the sense amplifiers. It follows that a restore operation on the entire row is subsequently required.

One disadvantage associated with the this approach is that a significant amount of power is required to bring an entire row of information into the sense amplifiers. Another disadvantage associated with this approach is that the sense amplifiers can only store data from one row of memory cells at a time. Therefore, data that was placed there before will need to be flushed even if that particular data is required immediately afterwards.

SUMMARY OF THE INVENTION

It is one object of the present invention to provide a memory in which power efficient memory accesses can be performed.

It is an object of the present invention to provide for sub-word memory accesses.

It is another object of the invention to provide for a memory in which sets of sense amplifiers corresponding to different sub-words of rows of memory can communicate data to different rows of the memory.

A memory design and method of operation is described. In one embodiment, the memory includes a group of memory cells divided into a plurality of sub-groups. Sub word-lines are selectively coupled to main word lines, each sub-word line corresponding to a sub-group. The sub-word lines are further coupled to the memory cells in the row of the corresponding sub-group. Sense amplifier circuitry is coupled to the group of memory cells. The sense amplifier circuitry is divided into a plurality of sub-sensing circuits, each of the plurality of sub-sensing circuits selectively coupled to a corresponding one of the plurality of sub-groups. The memory includes a control mechanism to control the word lines and sub-sensing circuit(s) that are activated at any one time such that only those sub-word lines and sub-sensing circuits needed to perform memory operations are operated and consume power.

In an alternate embodiment, the control mechanism controls the sub-word lines and sub-sensing circuits to enable substantially concurrent access to different sub-groups of memory cells from different rows of the memory.

Other objects, features, and advantages of the present invention will be apparent from the accompanying drawings and from the detailed description that follows below.

BRIEF DESCRIPTION OF THE DRAWINGS

The present invention is illustrated by way of example and not imitation in the figures of the accompanying drawings, in which like references indicate similar elements and in which.

DETAILED DESCRIPTION

The apparatus and method of the present invention provides for an innovative memory structure and method for accessing the memory cells contained therein. In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Although the present invention is described with respect to dynamic random access memory (DRAM), it is apparent to one skilled in the art that the invention is readily applicable to other memories including static memories and electrically programmable memories (e.g. EPROMS).

The invention describes sub-group accessing of memory cells from the array. A group can be defined as a bank of memory cells. As is readily apparent to one skilled in the art, a group also can be defined to a subset or a superset of a bank of memory cells. In addition, the present invention is described with respect to memory of a determined size and the number of control signals and lines are correspondingly allocated. It is readily apparent that the present invention is not limited to a memory of a particular size and the number of control signals and lines can be varied to accommodate the size of the memory.

Figures 1, 1A:
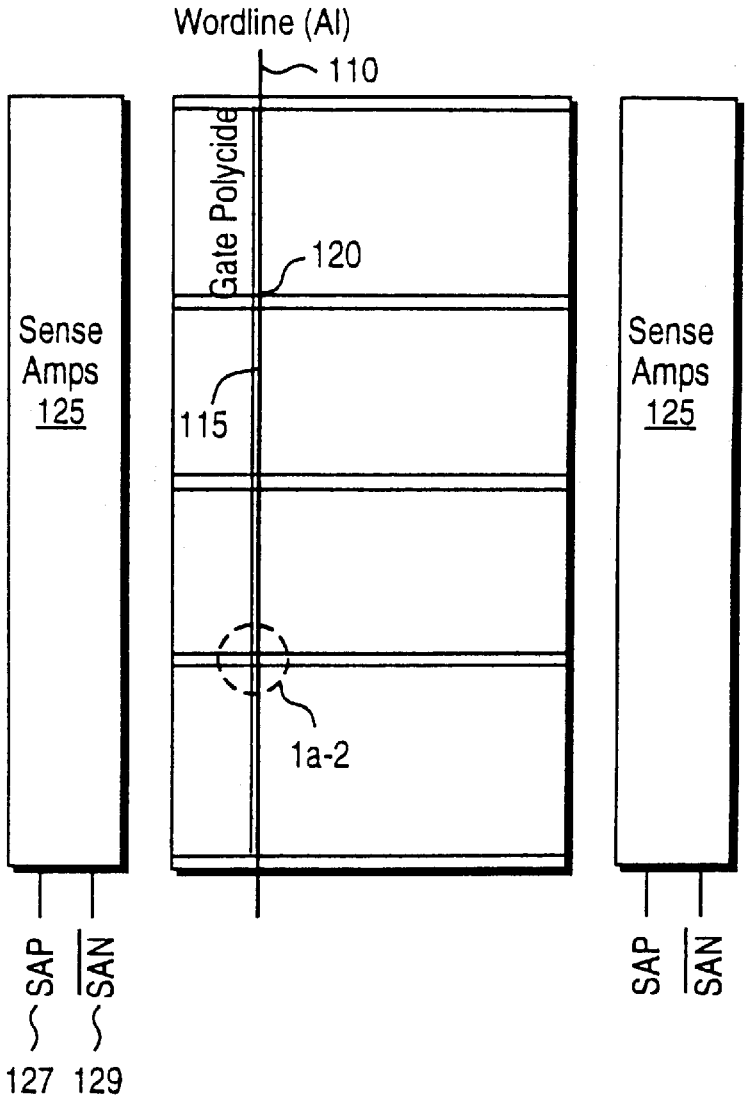
FIG. 1a-1 (Prior Art)
FIG. 1a is a prior art block diagram of a dynamic random access memory (DRAM) illustrating one example of word line connections and FIG. 1b is a prior art block diagram of a DRAM illustrating a dual word line connection.
Figures 1, 1A, 2:
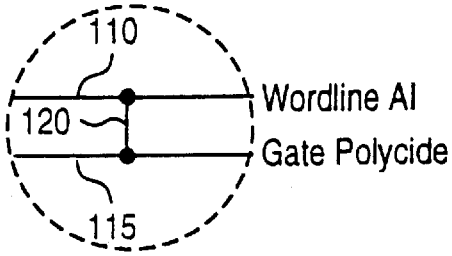
FIG. 1a-2 (Prior Art)
FIG. 2 is a simplified block diagram of one embodiment of a DRAM in accordance with the teachings of the present invention.
Figures 1, 1B:
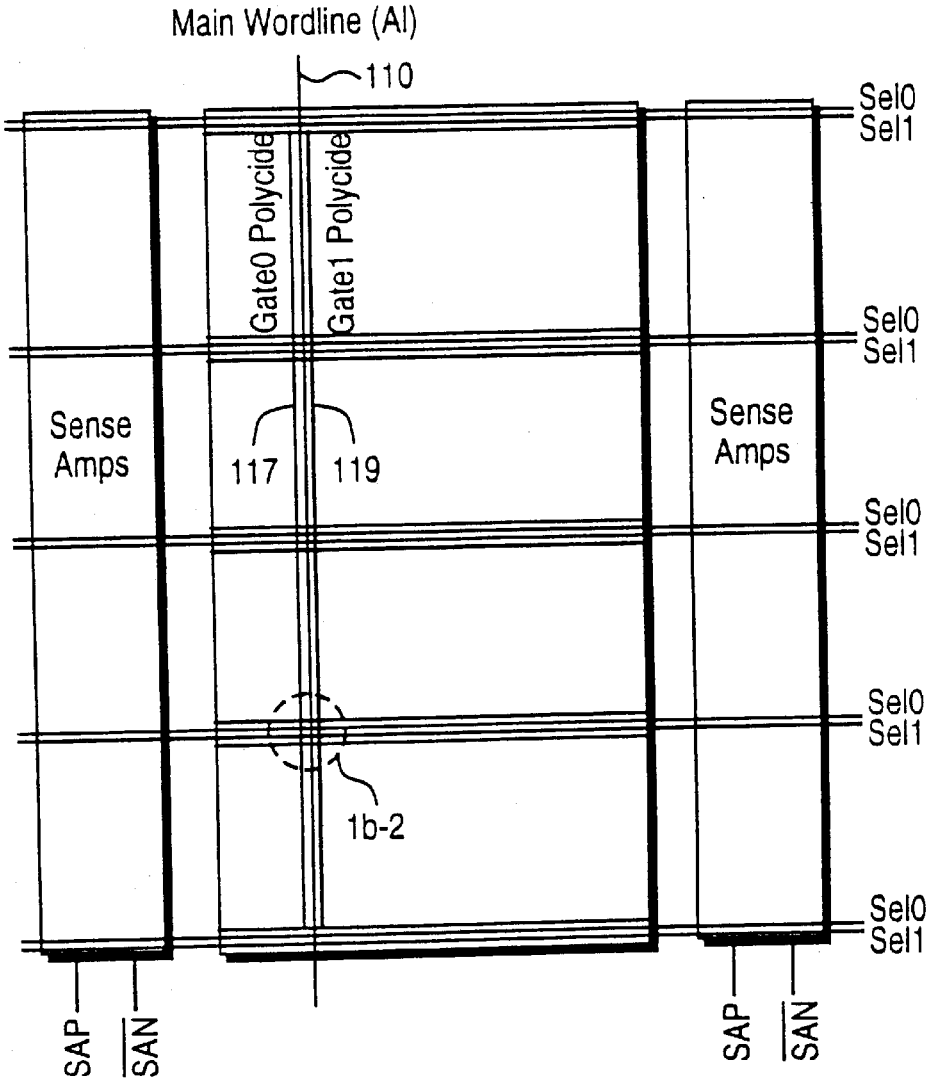
FIG. 1b-1 (Prior Art)
Figures 1, 1B, 2:
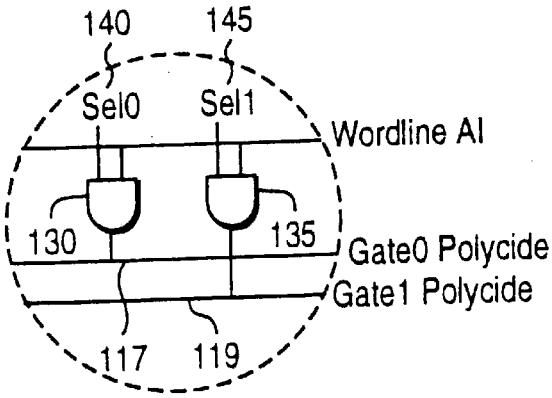
FIG. 1b-2 (Prior Art)
Figure 2:
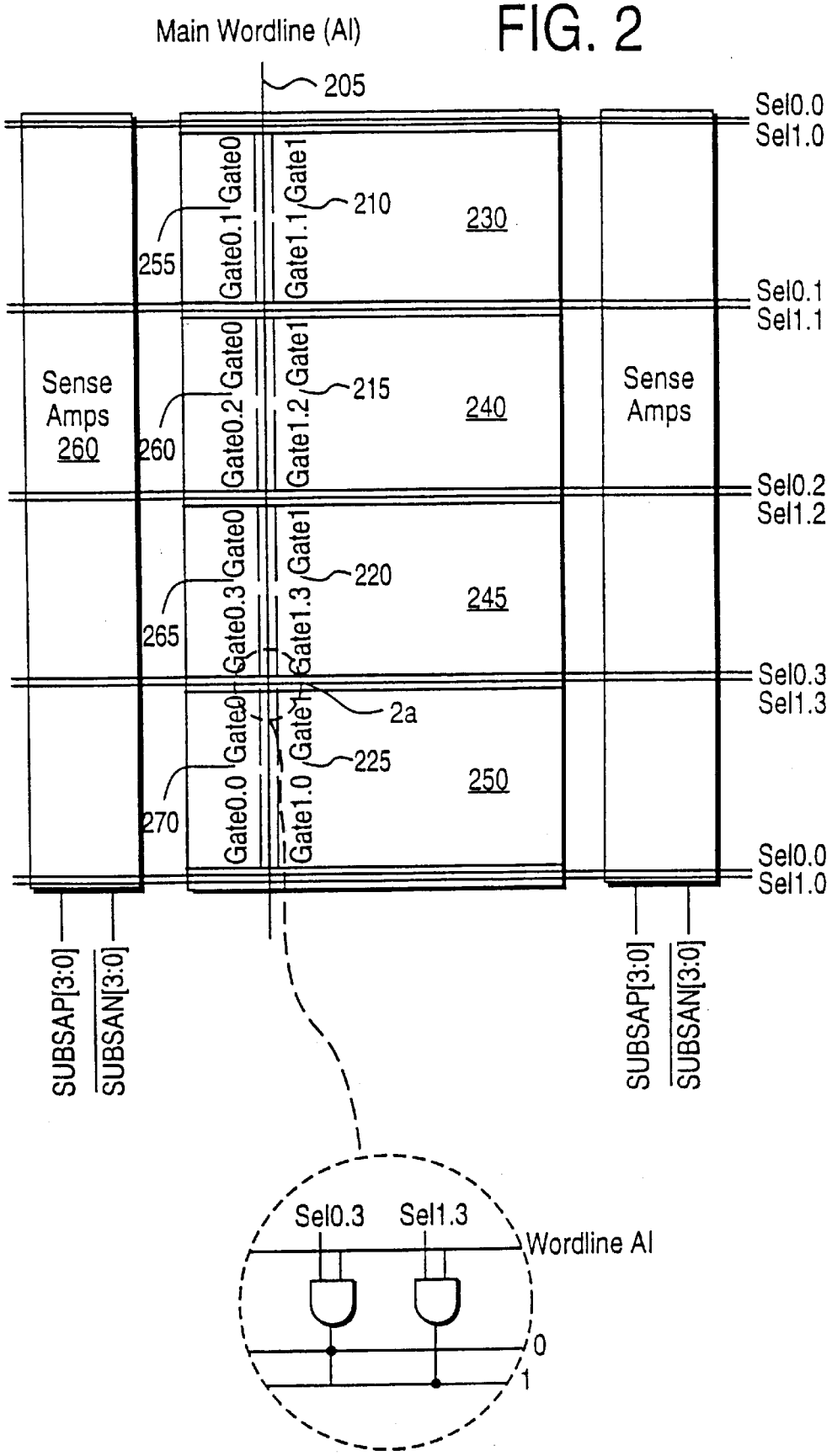

FIG. 2 is a simplified block diagram of one embodiment of the DRAM of the present invention. FIG. 2 illustrates a dual word line structure that includes word line metal 205 and word line gate polysilicon zero (GP0) and one (GP1). Word lines GP0 and GP1 are each broken up into unconnected segments, each approximately spanning the distance of a sub-group of memory cells. For example, referring to FIG. 2, word line GP0 is broken up into segments 255, 260, 265, 270 and word line GP1 is broken up into segments 210, 215, 220, 225, each segment capable of being separately enabled using control signals sel [[0.3–0.1, 1.3–1.0]] (*0.3–0.0, 1.3–1.0*).

Furthermore, the DRAM includes logic that enables a corresponding subset of the sense amplifiers in order to perform a memory operation. In particular, the SAP and SAN signals are expanded to be multiple bits, e.g., SUBSAP [3:0], $\overline{\text{SUBSAN}}$ [3:0], in order to address specific subsets of sense amplifiers of the column of sense amplifiers 260. These signals can be routed separately from top to bottom, or generated in the area near the subset (e.g., in the strap areas) from a master signal. Area penalty is minimal as the width of the areas and size of the drivers need only be one fourth of the original width and size. Thus, the word line segments and corresponding subsets of sense amplifiers are selectively enabled to perform memory access for a sub-group of a row of memory cells. It can readily be understood that substantial power savings are achieved as only a fraction of the sense amplifiers and a corresponding fraction of the word line gate polysilicon are activated. As is readily apparent, use of SUBSAP and $\overline{\text{SUBSAN}}$ control signals are exemplary; different control signals can be used for different memories and differents types of DRAMS.

Figure 3:
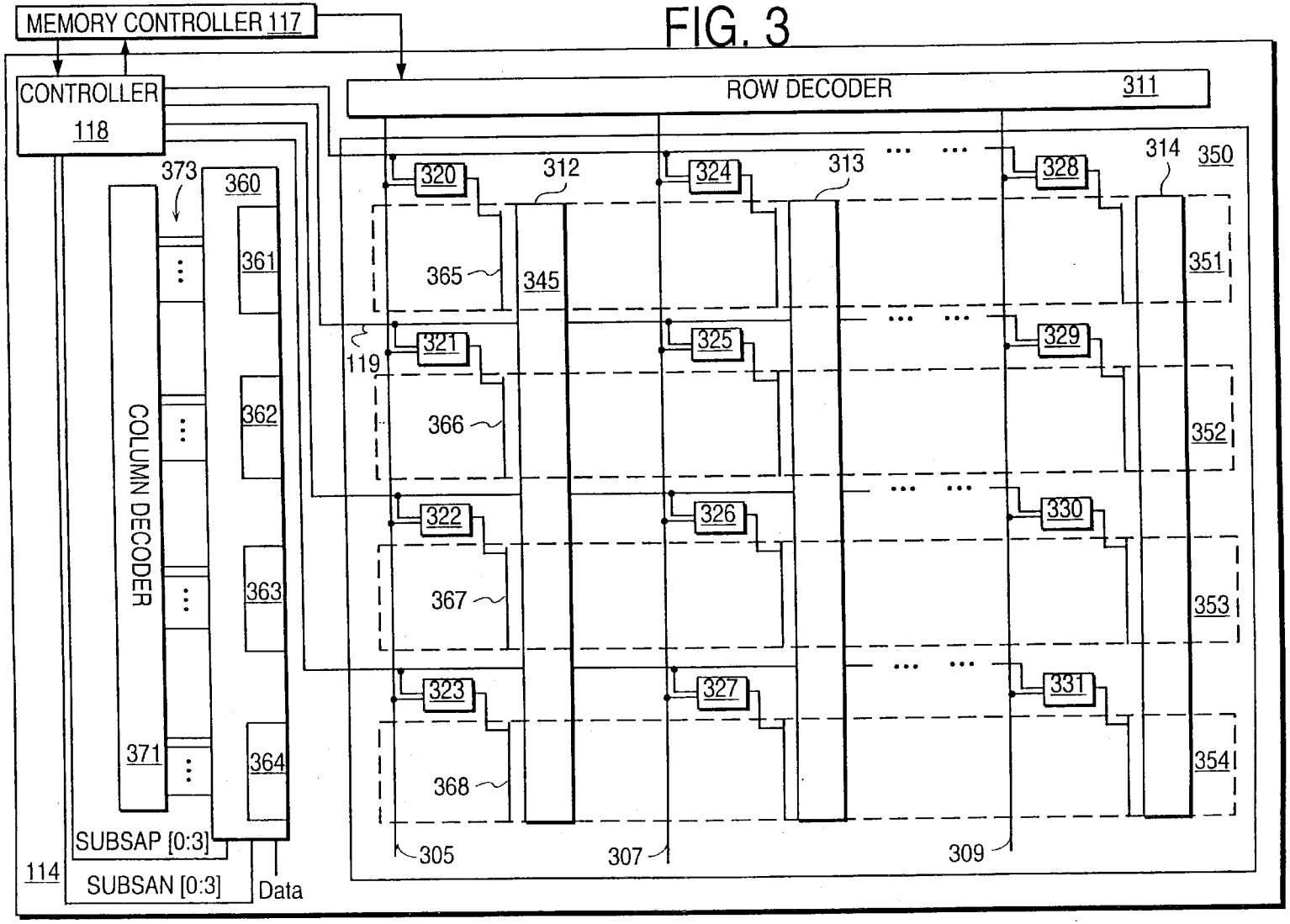
FIG. 3 illustrates a block diagram of one embodiment of a portion of a DRAM that operates in accordance with the teachings of the present invention.

FIG. 3 is a slightly more detailed block diagram of a DRAM constructed in accordance with the teachings of the present invention. It is apparent to one skilled in the art, numerous details not distinctive to the teachings of the present invention are omitted for purpose of explanation.

Furthermore, certain control logic is shown in functional block form; it is readily apparent that a variety of implementations can be used to perform the function described.

Referring to FIG. 3, the DRAM 114 includes a memory array, or portion thereof, 350 sense amplifier circuitry 360 row decoder circuitry 311, column decoder circuitry 371 and controller 118.

In the present embodiment, the controller 118 receives control signals from memory controller 117, including signals to indicate that sub-group sensing is to be performed. For example, in one embodiment the memory controller 117 issues signal SUBACT, to indicate that sub-group sensing is to be performed and [SADR[3:0]] *SADR(3:0)* which identifies the sub-group(s) to be sensed.

As is readily apparent to one skilled in the art, the present invention is not limited to these specific control signals or the structure of the memory controller 117 issuing certain signals to controller 118. A variety of embodiments, in which different embodiments of signals including signals that may be issued by a processor (not shown) coupled to the memory controller 117 or memory 114 is contemplated. Furthermore, embodiments which do not include on chip controller circuitry also are contemplated.

Continuing with the present embodiment, the controller 118 issues control signals to selectively activate a word line segment (e.g., segments 365, 366, 367, 368) and corresponding sub-group of the sense amplifier (e.g., sub groups 361, 362, 363, 364). For example, to perform a memory access operation with respect to one sub-group of memory cells, delineated by area 352, controller 118 issues an activation signal on line 119. Thus, when row decoder 311 selects a corresponding word line metal to activate, for example, word line metal 305, the controller 118 activates line 119 such that gate 321 activates word segment 366. In addition, controller 118 issues SUBSAP, $\overline{\text{SUBSAN}}$ signals to activate the corresponding portion 362 of sense amplifier circuitry 360.

Figure 4:
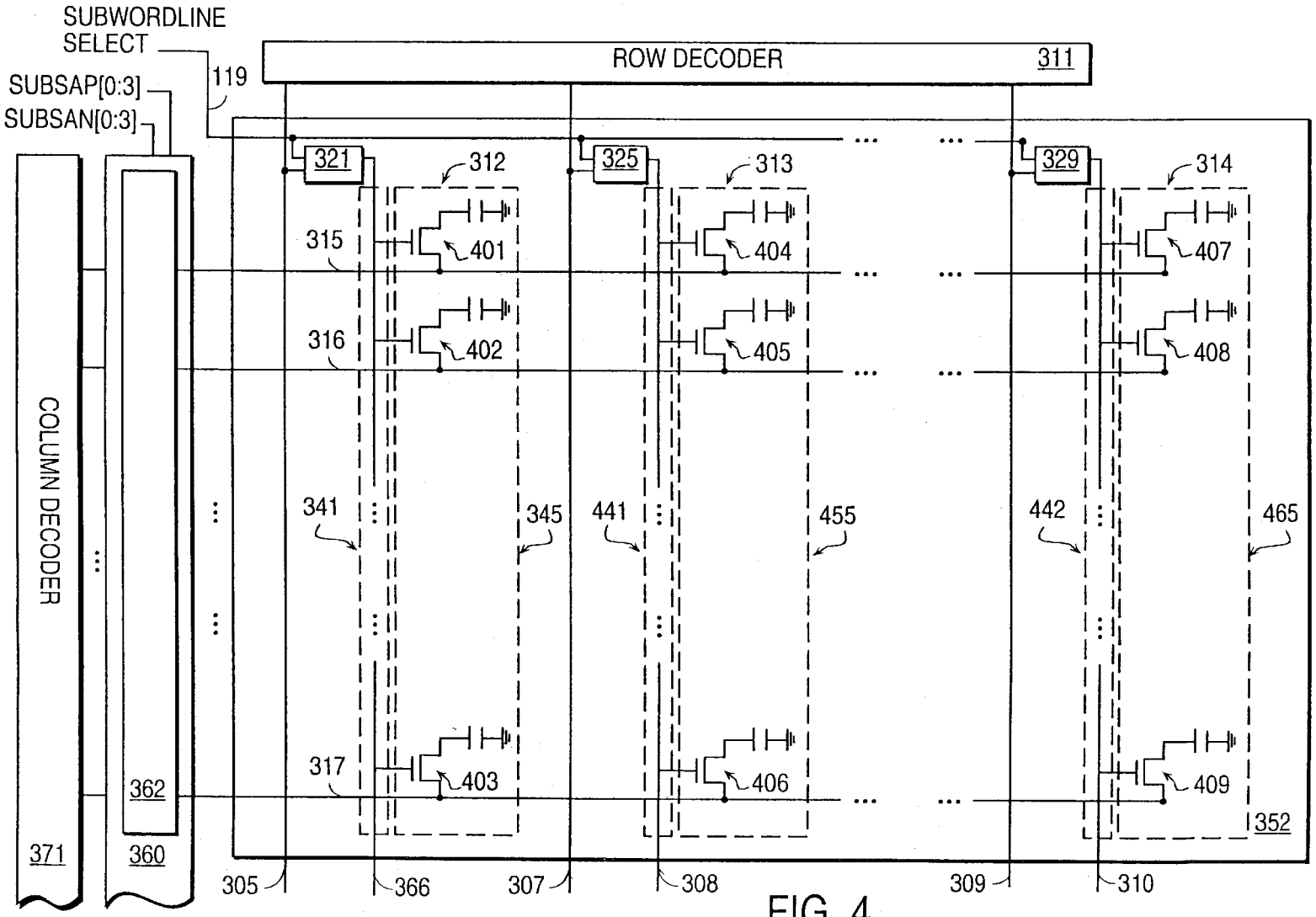
FIG. 4 illustrates one embodiment of a sub-group of memory cells and associated circuitry.
Figure 5:
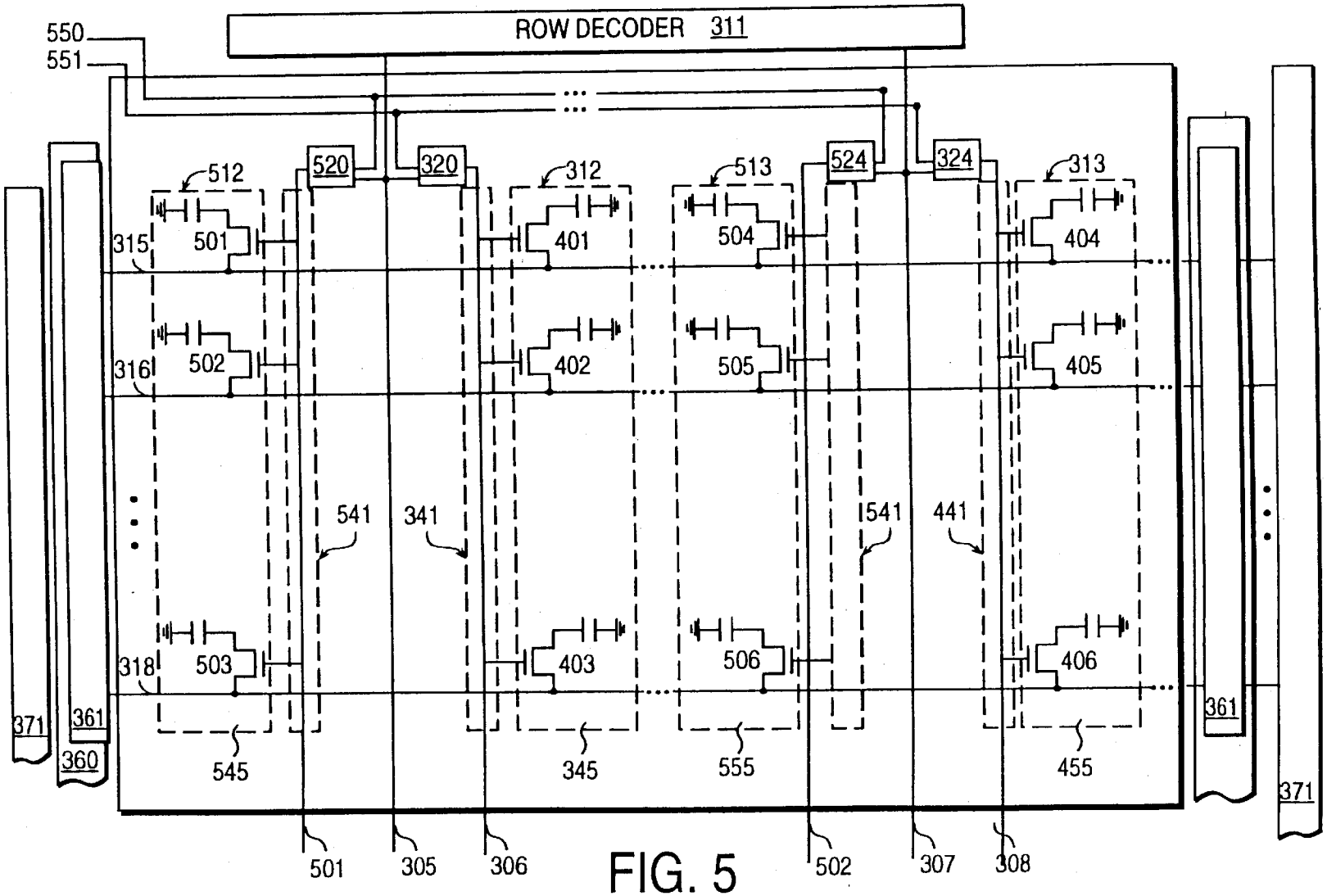
FIG. 5 illustrates an alternate embodiment of a sub-group of memory cells and associated circuitry.

FIG. 4 is a slightly more detailed diagram of one sub-group 352 of the memory that is individually accessible in accordance with the teachings of the present invention. This embodiment, illustrative of a single or conventional word line access, selects a sub-group of the memory array represented by cells 401, 402, 403. Activation of word line segment [367] *366* by activation of the sub word line select signal 119 by controller 118 and word line metal 305 causes the data to be available on the bitlines represented by lines 315, 316 and 317. The controller issues the appropriate [SUBSAP[3:0]] *SUBSAP(3:0)* and [SUBSAN[3:0]] *SUBSAN(3:0)* to select the corresponding portion 362 of sense amplifier circuitry to perform the desired operation (e.g., sense). FIG. 5 is illustrative of an embodiment which utilizes a dual word line structure. As is readily apparent to one skilled in the art, sub-group access can be applied to different memory access structures to improve the efficiency of access.

The architecture of memory array therefore allows a sub-group of memory cells to be sensed during a row operation. Thus, when only a portion of a row of memory cells needs to be accessed, only the corresponding word line section and sub-group of sense amplifiers designated to sense those memory cells are activated. By turning on only the necessary circuitry required for sensing requested data, power consumption is reduced.

In an alternate embodiment, the structure for sensing sub-groups of rows of memory cells can be configured to concurrently access sub-groups of cells from different rows of the memory. In this embodiment, the row decoder circuitry would be modified to activate more [from] *than* one word line metal at a time. The control signals issued to control the selection of sections of the word lines and corresponding sub-groups of the sense amplifiers would also be modified correspondingly. Additional control logic would be required to ensure that only the sub-group associated with the desired row is sensed. For example, in one approach, additional control signals are issued by controller 118, each control signal separately connected to a different segment in a different row. Alternately, a row/segment control signal is issued and the gate (e.g., 320–331, FIG. 3) is expanded to include logic to decode the row/segment control signal to activate the specified segment in the particular row.

It will be appreciated that the memory architecture of the present invention may be implemented for pulse word line sensing and level word line sensing operations. For a memory that implements level word line sensing, where the word line remains activated after a sense cycle and restore cycle, subsequent writes to the sense amplifier circuitry will update both the sense amplifier circuitry and the memory cells selected by the word line. In a memory that implements pulse word line sensing where the word line deactivates after a sense and restore cycle, an explicit restore cycle is executed before retiring a row when the data in the sense amplifier circuitry has been updated by an earlier write (e.g., by a CAS write). This is desirable as updates done to the sense amplifiers are not updated in the memory cells.

Figure 6A:
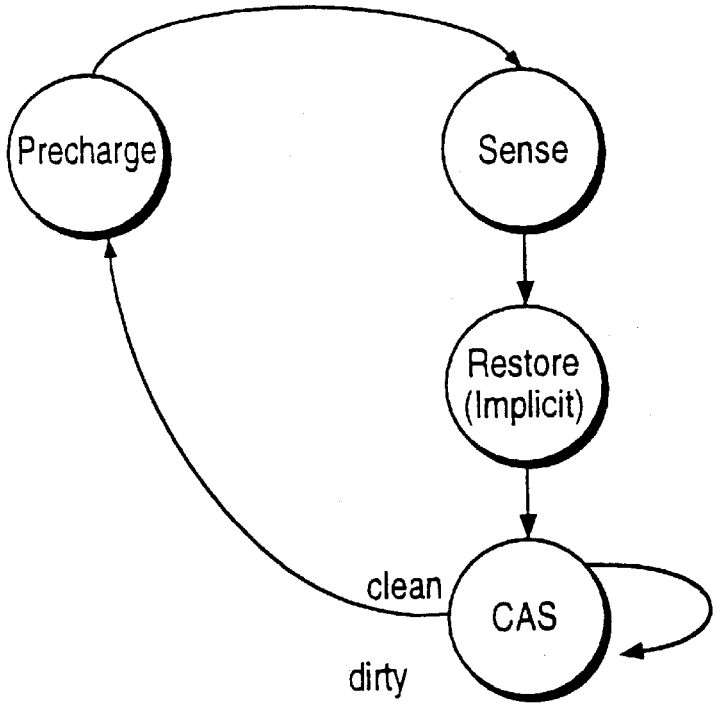
FIG. 6a is a state diagram illustrating one embodiment of a process for accessing memory cells of the DRAM and FIG. 6b is a state diagram illustrating an alternate embodiment of a process for access memory cells of the DRAM.

FIG. 6a shows one embodiment of the state transitions that occur for a level word line memory. If a row already is in the sensed state, bringing in a new row requires as executing a precharge followed by a sense and a restore. As is well known in the art, the term precharge refers to the process of turning off the sense amplifiers and setting all the bit lines to Vdd/2. All information that was in the sense amplifiers is lost; new data can then be placed in the sense amplifiers. The term sense refers to the process of activating the selected word line or section of a word line, activating the corresponding sense amplifiers and latching the data into the sense amplifiers. Since the transfer of data from the memory cells to the sense amplifiers is a destructive read, a restore operation is needed to write the data from the sense amplifiers back to the memory cells. The term restore therefore refers to an implicit, automatic restore operation that occurs after the sense operation. After the restore, CAS read and write operations can be executed to that row or a portion of that row. In this implementation, all writes are updated in both the sense amplifiers and the memory cells and the sense amplifiers can be turned off at any time using a precharge operation without any ill effects.

Figure 6B:
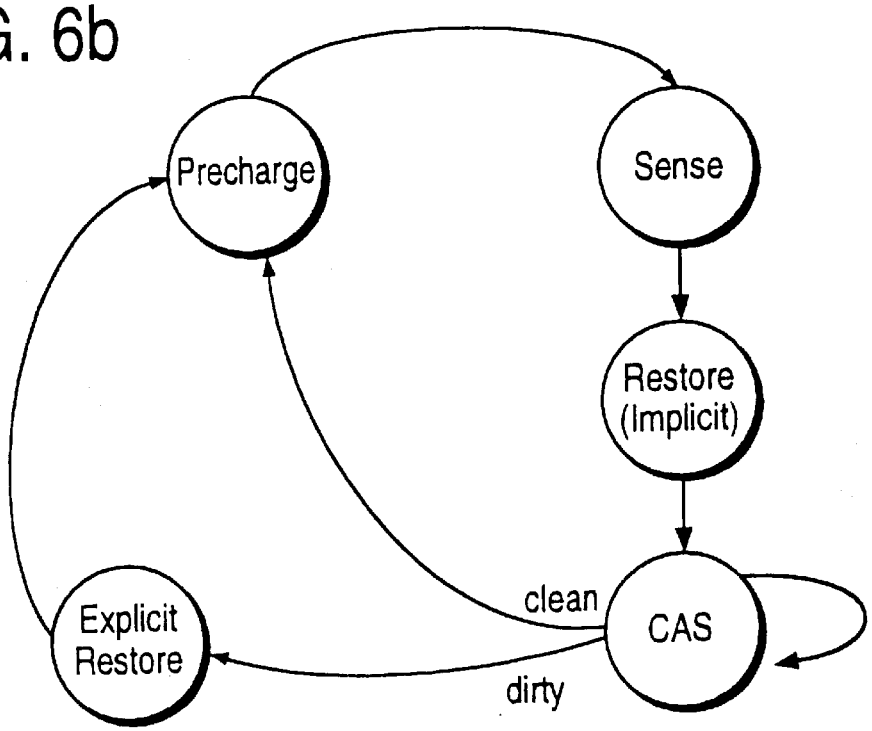

FIG. 6b illustrates one embodiment of a state transition diagram for pulsed word line operation. This process utilizes an explicit restore state in which a word line or segment of a word line is activated and data is transferred from the sense amplifiers back to the memory cells selected by the word line. The explicit restore state is performed prior to a precharge if the sense amplifiers have been updated via a CAS write (i.e., the sense amplifier are dirty). This action activates the word line and updates the memory cells associated with the row currently sensed. If the sense amplifiers have not been updated via a CAS write (i.e., the sense amplifiers are clean), then the precharge operation can occur without executing an explicit restore cycle.

The utilization of level word line sensing and pulse word line sensing will now be discussed. Without adding circuitry to enable multiple word line activation, one way of implementing sub-wordline sensing using a level word line implementation would be to turn off all sense amplifiers before bringing in a new row (with 1 to 4 sections activated). Data can also be brought from multiple word lines. This is illustrated by the following example. Assume a simple case in which a memory core includes a single bank of memory cells. Each bank consists of 1024 rows and each row contains 2048 bits coupled to 2048 sense amplifiers. Each word line is subdivided into 4 sub-groups, each controlling 512 sense amplifiers.

Assume an initial state [that] *in which* the sense amplifiers are turned on, but the data contained in the sense amplifiers is clean. The example includes the processing of the following three requests:

Request 1: Bring in row 100, sections 1 and 2

Request 2: Bring in row 200, sections 2 and 3

Request 3: Bring in row 300, sections 3 and 4

In a level word line implementation, the following events would happen in response to the requests:

[Request 1:Precharge Turn off the sense amplifiers in sections 1 and 2. Set bitlines in sections 1 and 2 to Vdd/2.

Sense Turn on word line 100 polysilicon for sections 1 and 2. Latch data onto sense amplifiers in sections 1 and 2.

Restore Drive sense amplifiers data back to word line 100 and polysilicon for sections 1 and 2.

Request 2: Precharge Turn off the sense amplifiers in sections 2 and 3 Set bitlines in sections 2 and 3 to Vdd/2. Release word line 100 polysilicon for section 2

Sense Turn on word line 200 polysilicon for sections 2 and 3. Latch data onto sense amplifier sub-groups 2 and 3

Restore Drive sense amplifier data back to word line 200 and polysilicon for sections 2 and 3

Request 3: Precharge Turn off the sense amplifiers in sections 3 and 4. Set bitlines in sections 3 and 4 to Vdd/2. Release word line 200 polysilicon for section 3.

Sense Turn on word line 300 polysilicon for sections 3 and 4. Latch data onto sense amplifier sections 3 and 4.

Restore Drive sense amp data back to word line 300 and word line polysilicon for sections 3 and 4.]

*Request 1: (Precharge) Turn off the sense amplifier sub-groups 1 and 2. Set bitlines in sections 1 and 2 to Vdd/2.*

*(Sense) Turn on word line 100 polysilicon for sections 1 and 2. Latch data into sense amplifier sub-groups 1 and 2.*

*(Restore) Drive data from sense amplifier subgroups 1 and 2 back to storage locations of word line 100 polysilicon for sections 1 and 2.*

*Request 2: (Precharge) Turn off the sense amplifiers in sections 2 and 3 Set bitlines in sections 2 and 3 to Vdd/2. Release word line 100 polysilicon for section 2.*

*(Sense) Turn on word line 200 polysilicon for sections 2 and 3. Latch data into sense amplifier sub-groups 2 and 3.*

*(Restore) Drive data from sense amplifier sub-groups 2 and 3 back to storage locations of word line 200 polysilicon for sections 2 and 3.*

*Request 3: (Precharge) Turn off the sense amplifiers in sections 3 and 4. Set bitlines in sections 3 and 4 to Vdd/2. Release word line 200 polysilicon for section 3.*

*(Sense) Turn on word line 300 polysilicon for sections 3 and 4. Latch data into sense amplifier sub-groups 3 and 4.*

*(Restore) Drive data from sense amplifier sub-groups 3 and 4 back to storage locations of word line 300 polysilicon for sections 3 and 4.*

Figure 7:
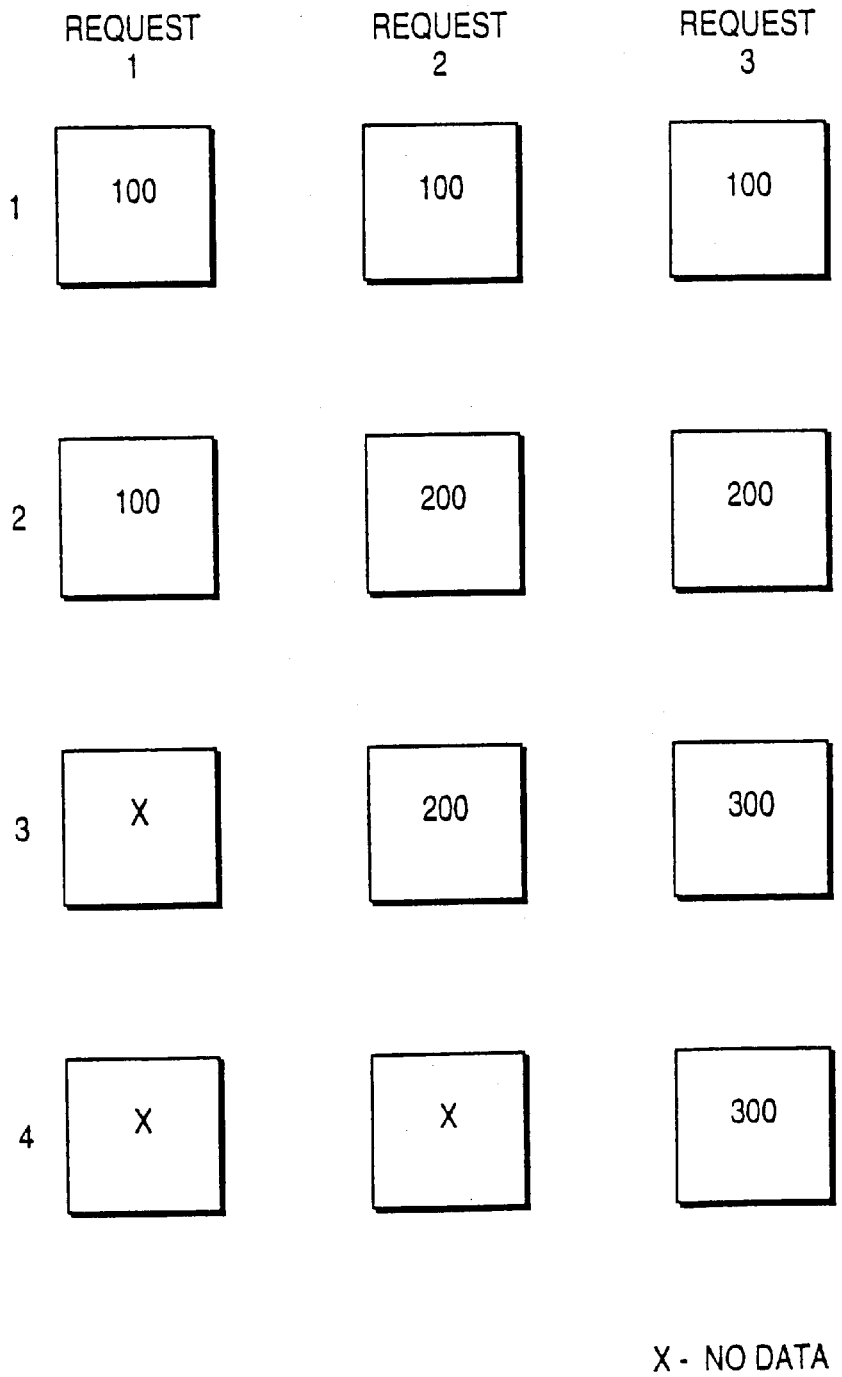
FIG. 7 is a diagram illustrating the states of sense amplifiers after processing requests.

FIG. 7 illustrates the state of the sense amplifiers after processing Requests 1, 2 and 3 for level word line sensing implementation described above and the pulse word line implementation described below.

In the pulse word line implementation, the following events would happen in response to the requests:

[Request 1: Precharge Turn off the sense amplifiers in sections 1 and 2. Set bitlines in sections 1 and 2 to Vdd/2.

Sense Turn on word line 100 polysilicon for sections 1 and 2. Latch data onto sense amplifiers in sections 1 and 2.

Restore Drive sense amplifier data back to word line 100 and polysilicon for sections 1 and 2.

Request 2: Explicit An explicit restore would be performed on Restore word line 100 polysilicon for section 2 (if necessary)

Precharge Turn off the sense amplifiers in sections 2 and 3 Set bitlines in sections 2 and 3 to Vdd/2.

Sense Turn on word line 200 polycide for sections 2 and 3. Latch data onto sense amplifiers 2 and 3

Restore Drive sense amplifier data back to word line 200 and polycides for sections 2 and 3

Request 3: Explicit An explicit restore would be performed on Restore word line 100 polycide for section 3 (if necessary)

Precharge Turn off the sense amplifiers in sections 3 and 4. Set bitlines in sections 3 and 4 to Vdd/2.

Sense Turn on word line 300 polysilicon for sections 3 and 4. Latch data onto sense amplifier sections 3 and 4.

Restore Drive sense amplifier data back to word line 300 and polysilicon for sections 3 and 4.]

*Request 1: (Precharge) Turn off sense amplifier sub-groups 1 and 2. Set bitlines in sections 1 and 2 to Vdd/2.*

*(Sense) Turn on word line 100 polysilicon for sections 1 and 2. Latch data into sense amplifier sub-groups 1 and 2.*

*(Restore) Drive data from sense amplifier sub-groups 1 and 2 to storage locations of word line 100 polysilicon for sections 1 and 2.*

*Request 2: (Explicit Restore) An explicit restore would be performed to storage locations of word line 100 polysilicon for section 2 (if necessary).*

*(Precharge) Turn off sense amplifier sub-groups 2 and 3. Set bit lines in sections 2 and 3 to Vdd/2.*

*(Sense) Turn on word line 200 polysilicon for sections 2 and 3. Latch data into sense amplifier sub-groups 2 and 3*

*(Restore) Drive data from sense amplifier sub-groups 2 and 3 to storage locations of word line 200 polysilicon for sections 2 and 3*

*Request 3: (Explicit Restore) An explicit restore would be performed to storage locations of word line 100 polycide for section 3 (if necessary).*

*(Precharge) Turn off sense amplifier sub-groups 3 and 4. Set bit lines in sections 3 and 4 to Vdd/2.*

*(Sense) Turn on word line 300 polysilicon for sections 3 and 4. Latch data into sense amplifier sub-groups 3 and 4.*

*(Restore) Drive data from sense amplifier sub-groups 3 and 4 to storage locations of word line 300 polysilicon for sections 3 and 4.*

It should be noted that explicit restores are not always required. For example, if the data were not changed (i.e., the sense amplifiers were not written to or "clean"), an explicit restore is not necessary. An explicit restore is needed after a sense amplifier has been written to or "dirty".

Furthermore, in this implementation, the controller in the memory would maintain a memory address tag to determine whether the address indicated in a request matches the address of data in the sense amplifier, a valid bit tag to determine whether data in the sense amplifiers is valid, and a dirty bit tag to determine whether the sense amplifiers are dirty for each subwordline section. These tags are used to determine whether or not a subwordline section has been made dirty and if so, which row address to explicitly restore it to.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A memory comprising:

a memory array of storage locations;

a plurality of word lines for selecting rows of the memory array, each word line comprising a plurality of segments, each segment spanning a portion of the distance of the word line;

a plurality of sets of sense amplifiers, each sense amplifier of the sets of sense amplifiers selectively coupled to one storage location associated with the word line, each set of sense amplifiers corresponding to a segment;

a first select logic for selecting at least one segment of a word line during a sense operation; and a second select logic for selecting at least one corresponding set of sense amplifiers.

2. The memory as set forth in claim 1, wherein the memory is located on a component and the first select logic comprises a controller located on the component.

3. The memory as set forth in claim 1, wherein the memory is located on a component and the second select logic comprises a controller located on the component.

4. The memory as set forth in claim 1, wherein the first select logic issues a select signal to a gate having as inputs the select signal and a row signal indicative that the row is selected, the output of the gate activating the selected segment when the select signal and the row signal are active.

5. The memory as set forth in claim 1, wherein the memory further comprises a plurality of gates, an output of each gate coupled to selectively activate a segment, each gate receiving as input a row signal indicative that a row is selected and a select signal indicative that a segment is selected.

6. The memory as set forth in claim 1, wherein the first select logic comprises a controller which issues a first select signal and a plurality of decoders each coupled to receive the first select signal and selectively activate a segment when row decode logic indicates tat the corresponding row is selected.

7. The memory as set forth in claim 1, wherein the second select logic issues the following signals:

SUBSAP[3:0] and $\overline{\text{SUBSAN}}$ [3:0]

wherein the bits set indicate the set of sense amplifiers that is to be activated.

8. A method for accessing a memory [comprising a plurality of storage locations], *that includes a plurality of storage locations arranged in rows and word lines for selecting the rows, each word line including a plurality of segments and each segment spanning a portion of the distance of the word line*, said method comprising the steps of:

[providing a plurality of word lines for selecting rows of a memory array, each word line comprising a plurality of segments, each segment spanning a portion of the distance of the word line;]

identifying sets of sense amplifiers, each sense amplifier of the sets of sense amplifiers coupled to one storage location associated with a word line, each set of sense amplifiers corresponding to a segment;

selecting at least one segment of a word line that is to be activated during a sense operation; and selecting at least one corresponding set of sense amplifiers.

9. The method as set forth in claim 8, wherein the set of selecting a segment comprises the steps of:

issuing a segment select signal to identify a segment to be selected;

issuing a row select signal to identify a row to be selected;

selecting a particular segment in a particular row based on the segment select signal and row select signal issued.

10. The method as set forth in claim 8, wherein the step of selecting a corresponding set of sense amplifiers comprises the step of issuing a set select signal to select a set of sense amplifiers.

11. The method as set forth in claim 8, wherein the access performed is a read operation, said method further comprising the steps of:

sensing the data of the selected segment, said sense operation placing the data in the corresponding set of sense amplifiers;

restoring the data to the selected segment; and performing a column address strobe (CAS) wherein the data in the corresponding set of sense amplifiers is output from the memory.

12. The method as set forth in claim 11, further comprising the step of precharging the sense amplifiers prior to performing the step of sensing the data.

13. The method as set forth in claim 8, wherein the access performed is a write operation, said method further comprising the steps of:

performing a level word line access, wherein the selected segment remains activated until another segment is selected; and performing a column address strobe (CAS) wherein data to be written is latched into the corresponding set of sense amplifiers, said CAS causing the data to further be stored in storage locations coupled to the selected segment.

14. The method as set forth in claim 8, wherein the access performed is a write operation, said method further comprising the steps of:

performing a pulse word line access, wherein the selected segment is activated prior to performing a sense cycle and restore cycle and deactivated after completion of the restore cycle;

performing a column address strobe (CAS) wherein data to be written is latched into the corresponding set of sense amplifiers; and performing an explicit restore operation thereby causing the data located in the corresponding set of sense amplifiers to be stored in storage locations coupled to the selected segment.

15. A memory comprising:

a plurality of word lines for selecting a row of a memory array, each word line comprising a plurality of segments, each segment spanning a portion of the distance of the word line;

a plurality of sets of sense amplifiers, each sense amplifier of the sets of sense amplifiers selectively coupled to one storage location associated with a word line, each set of sense amplifiers corresponding to a segment;

a first select logic for selecting during a sense operation at least one segment from a first word line and at least one segment from a second word line; and a second select logic for selecting corresponding sets of sense amplifiers to access storage locations along the first segment and the second segment.

16. The memory as set forth in claim 15, wherein the memory is located on a component and the first select logic comprises a controller located on the component.

17. The memory as set forth in claim 15, wherein the memory is located on a component and the second select logic comprises a controller located on the component.

18. The memory as set forth in claim 15, wherein the first select logic issues a first select signal to a first gate and a second select signal to a second gate, the first gate and second gate further respectively receiving as input a first row signal and second row signal indicative that the first row and second row, respectively, are selected, the output of the first gate activating the first selected segment when the first select signal and the first row signal are active and the output of the second gate activating the second selected segment when the second select signal and the second row signal are active.

19. The memory as set forth in claim 15, wherein the memory further comprises a plurality of gates, an output of each gate coupled to selectively activate a segment of a row, each gate receiving as input a row signal indicative that a row is selected and a select signal to indicate selection of a segment in a particular row.

20. The memory as set forth in claim 15, wherein the first select logic comprises a controller which issues a first select signal and a plurality of decoders each coupled to receive the first select signal and selectively activate a coupled segment when row decode logic indicates that the corresponding row is selected.

21. The memory as set forth in claim 15, wherein the second select logic issues the following signals:

SUBSAP[3:0] and SUBSAN [3:0]

wherein the bits set indicate the set of sense amplifiers that is to be activated.

22. A method for accessing a memory [comprising a plurality of storage locations] *that includes a plurality of storage locations arranged in rows and word lines for selecting the rows, each word line including a plurality of segments and each segment spanning a portion of the distance of the word line*, said method comprising the steps of:

[providing a plurality of word lines for selecting rows of a memory array, each word line comprising a plurality of segments, each segment spanning a portion of the distance of the word line;]

identifying sets of sense amplifiers, each sense amplifier of the sets of sense amplifiers coupled to one storage location associated with a word line, each set of sense amplifiers corresponding to a segment;

selecting at least one segment of a first word line to activate during a sense operation;

selecting at least one segment of a second word line that is to be activated during a sense operation; and selecting sets of sense amplifiers corresponding to the at least one segment of the first word line and at least one segment of the second word line to access storage locations along the first segment and the second segment.

23. The method as set forth in claim 22, wherein:

the step of selecting at least one segment of a first word line comprises the steps of issuing a first select signal; and the step of selecting at least one segment of a second word line comprises the step of issuing a second select signal.

24. The method as set forth in claim 22, further comprising the step of issuing a select signal that identifies at least one segment of at least one row to be selected;

wherein the steps of selecting at least one segment of a first word line and at least one segment of a second word line comprise decoding the select signal to determine the segments to select.

25. The method as set forth in claim 22, wherein the step of selecting sets of sense amplifiers comprises the step of issuing the following signals:

SUBSAP[3:0] and SUBSAN [3:0]

wherein the bits set indicate the set of sense amplifiers to activate.

26. The method as set forth in claim 22 wherein the access performed is a read operation, said method further comprising the steps of:

sensing the data of the selected segments, said sense operation placing the data in the corresponding set of sense amplifiers;

restoring the data to the selected segments; and performing a column address strobe (CAS) wherein the data in the corresponding sets of sense amplifiers are output from the memory.

27. The method as set forth in claim 26, further comprising the step of precharging the sense amplifiers prior to performing the step of sensing the data.

28. The method as set forth in claim 22, wherein the access performed is a write operation, said method further comprising the steps of:

performing a level word line access, wherein the selected segments remains activated until another segment is selected; and performing a column address strobe (CAS) wherein data to be written are latched into the corresponding sets of sense amplifiers, said CAS causing the data to further be stored in storage locations coupled to the selected segments.

29. The method as set forth in claim 22, wherein the access performed is a write operation, said method further comprising the steps of:

performing a pulse word line access, wherein the selected segments are activated prior to performing a sense cycle and restore cycle and deactivated after completion of the restore cycle;

performing a column address strobe (CAS) wherein data to be written is latched into the corresponding sets of sense amplifiers; and performing an explicit restore operation thereby causing the data located in the corresponding sets of sense amplifiers to be stored in storage locations coupled to the selected segments.

30. The method as set forth in claim 22, wherein the access performed is a write operation, said method further comprising the steps of:

performing a pulse word line access, wherein the selected segments are activated prior to performing a sense cycle and restore cycle and deactivated after completion of the restore cycle;

performing a column address strobe (CAS) wherein data to be written is latched into the corresponding sets of sense amplifiers;

performing an explicit restore operation with respect to the first segment thereby causing the data located in the corresponding set of sense amplifiers to be stored in storage locations coupled to the first segment; and performing an explicit restore operation with respect to the the second segment thereby causing the data located in the corresponding set of sense amplifiers to be stored in storage locations coupled to the second segment.

*31. A memory comprising:*

*storage locations arranged in rows;*

*a word line to select a first row of the storage locations, the word line including a plurality of word line segments coupled to enable access to respective sub-groups of the storage locations in the first row; and*

*a first selection circuit to selectively activate a variable number of the word line segments in accordance with a control value that indicates a pattern of the word line segments to be activated.*

*32. The memory of claim 31 further comprising a plurality of sets of sense amplifiers, the sets of sense amplifiers coupled respectively to the sub-groups of the storage locations.*

*33. The memory of claim 32 further comprising a second selection circuit configured to selectively activate a variable number of the sets of sense amplifiers in accordance with the control value.*

*34. The memory of claim 32 wherein the plurality of sets of sense amplifiers are coupled to the first select circuit and a variable number of the sets of sense amplifiers are activated in accordance with the control value.*

*35. The memory of claim 32 further comprising a memory address tag to store an address, the address corresponding to a first storage location of the sub-groups of the storage locations.*

*36. The memory of claim 32 further comprising a valid tag to indicate that data sensed in at least one set of the sets of sense amplifiers is valid.*

*37. The memory of claim 32 further comprising a dirty tag to indicate that data has been written to the at least one set of the sets of sense amplifiers.*

*38. The memory of claim 31 further comprising circuitry to receive a sub-group activation signal, the select logic configured to activate the variable number of the word line segments in accordance with the control value if the sub-group activation signal is in a first state.*

*39. The memory of claim 38 wherein the control value includes a plurality of bits, each bit corresponding to a respective word line segment.*

*40. The memory of claim 31 further comprising:*

*a second word line to select a second row of the storage locations, the second word line including a second plurality of word line segments each coupled to enable access to a respective sub-group of the storage locations in the second row; and*

*select logic to concurrently activate at least one of the word line segments included in the second word line and the variable number of the sets of word line segments in the first row.*

*41. The memory of claim 40 wherein further comprising a row decoder to receive a row address, the row decoder selecting both the first and second word lines in accordance with the row address.*

*42. A memory comprising:*

*a memory array of storage locations*

*sense amplifier circuitry, including a plurality of sets of sense amplifiers coupled to respective sub-groups of the storage locations; and*

*first selection circuitry to selectively activate a variable number of the sets of sense amplifiers in accordance with a control value that indicates a pattern of the sets of sense amplifiers to be activated.*

*43. The memory of claim 42 further comprising:*

*a word line to select a first row of the storage locations the word line including a plurality of word line segments coupled to enable access to the respective sub-groups of the storage locations in the first row; and*

*second selection circuitry to selectively activate a variable number of the word line segments in accordance with the control value.*

*44. The memory of claim 43 further comprising:*

*a second word line to select a second row of the storage locations, the word line including a second plurality of word line segments each coupled to enable access to a respective sub-group of the storage locations in the second row; and*

*third selection circuitry to concurrently activate at least one of the word line segments included in the second word line in accordance with the control value.*

*45. The memory of claim 44 further comprising a row decoder to receive a row address, the row decoder selecting both the first and second word lines in accordance with the row address.*

*46. The memory of claim 42 further comprising a memory address tag to store an address, the address corresponding to a storage location of data sensed in at least one set of the sets of sense amplifiers.*

*47. The memory of claim 46 further comprising:*

*a valid tag to indicate whether the data latched in the at least one set of sense amplifiers is valid.*

*48. The memory of claim 46 further comprising:*

*a dirty tag to indicate that data has been written to the at least one set of sense amplifiers.*

*49. A memory comprising:*

*storage locations arranged in rows;*

*a first word line to select a first row of the storage locations, the first word line including a plurality of word line segments coupled to enable access to respective sub-groups of the storage locations in the first row:*

*a second word line to select a second row of the storage locations, the second word line including a plurality of word line segments coupled to enable access to respective sub-groups of the storage locations in the second row; and*

*selection circuitry to concurrently activate a first word line segment included in the first word line and a second word line segments included in the second word line.*

*50. The memory of claim 49 further comprising a row decoder to receive a row address, the row decoder selecting both the first and second word lines in accordance to the row address.*

*51. The memory of claim 49 further comprising:*

*a first set of sense amplifiers coupled to a first sub-group of storage locations, the first sub-group of storage locations corresponding to the first word line segment included in the first word line; and*

*a second set of sense amplifiers coupled to a second sub-group of storage locations, the second sub-group of storage locations corresponding to the second word line segment included in the second word line.*

*52. The memory of claim 51 further comprising:*

*a memory address tag to store an address, the address corresponding to a storage location address of data sensed in the first set of sense amplifiers;*

*a valid tag to indicate whether the data sensed in the first set of sense amplifiers is valid; and*

*a dirty tag to indicate whether the data sensed in the first set of sense amplifiers data has been updated.*

*53. A memory comprising:*

*storage locations arranged in rows and columns;*

*sense amplifiers coupled respectively to the columns of storage locations, the sense amplifiers including first and second sets of sense amplifiers;*

*a first word line to select a first row of the storage locations, the first word line including a plurality of word line segments coupled to enable access to respective sub-groups of the storage locations in the first row;*

*a second word line to select a second row of the storage locations, the second word line including a plurality of word line segments coupled to enable access to respective sub-groups of the storage locations in the second row; and*

*selection circuitry to activate at least one of the word line segments included in the first word line to transfer contents of the corresponding sub-group of the storage locations in the first row to the first set of sense amplifiers and to activate at least one of the word line segments included in the second word line to transfer contents of the corresponding sub-group of the storage locations in the second row to the second set of sense amplifiers.*

*54. The memory of claim 53 further comprising a row decoder to receive a row address and to select both the first and second word lines in accordance with the row address.*

*55. The memory of claim 54 further comprising:*

*a memory address tag to store an address, the address corresponding to a storage location of data latched in the first sets of sense amplifiers;*

*a first tag to indicate whether the data latched in the first set of sense amplifiers is valid; and*

*a second tag to indicate whether the data has been written to the first set of sense amplifiers.*

*56. A method of operation in a memory, the method comprising:*

*receiving a control value that indicates sub-groups of a row of storage locations within a first row of the memory; and*

*activating more than one and fewer than all of a plurality of word line segments in accordance with the control value to enable access to the corresponding sub-groups of the storage locations in the first row.*

*57. The method of claim 56 further comprising storing an address in an address tag, the address being representative of one storage location of the storage locations in the first row.*

*58. The method of claim 56 wherein the memory further includes a plurality of sets of sense amplifiers each coupled to respective sub-groups of the storage locations in the first row, the method further including transferring data from storage locations corresponding to the activated plurality of word line segments in the first row to the corresponding plurality of sets of sense amplifiers.*

*59. The method of claim 58 further comprising:*

*inputting data from an external signal line;*

*writing the data to at least one sense amplifier of the plurality of sets of sense amplifiers; and*

*setting a dirty tag to indicate the writing of data to the at least one sense amplifier.*

*60. The method of claim 56 further comprising activating at least one word line segment of a plurality of word line*

*segments in a second row to enable access to at least one corresponding sub-group of the storage locations in a second row.*

*61. The method of claim 60 wherein the control value is further indicative of the at least one corresponding sub-group of the storage locations within the second row.*

*62. The method of claim 56 wherein the memory further comprises a plurality of sets of sense amplifiers coupled to respective sub-groups of storage locations in the first row, the method further comprising:*

*transferring data from storage locations corresponding to at least one activated word line segment to a corresponding set of sense amplifiers; and*

*setting a valid bit to indicate that the data transferred is valid.*

*63. The method of claim 56 wherein the memory further comprises a first set of sense amplifiers coupled to a first sub-group of the storage locations in the first row and a second set of sense amplifiers coupled to a second sub-group of storage locations in a second row, the method further comprising:*

*transferring data corresponding to the first sub-group of the storage locations in the first row to the first set of sense amplifiers; and*

*transferring data corresponding to the second sub-group of storage locations in a second row to the second set of sense amplifiers.*

*64. The method of claim 56 wherein the control value includes a plurality of bits, each bit corresponding to a respective one of the plurality of word line segments in the first row.*

*65. The method of claim 56 further comprising receiving a sub-group selection activation signal, wherein the sub-groups of the storage locations in the first row corresponding to the control value are activated in accordance to the control value if the sub-group selection activation signal is in a first state.*

* * * * *